(12) United States Patent
Lee et al.

(10) Patent No.: US 6,781,457 B2
(45) Date of Patent: Aug. 24, 2004

(54) DROP AMPLIFIER HOUSING WITH MULTIPLE TIERS

(75) Inventors: Jay Lee, Whitby (CA); Ben Newell, Whitby (CA)

(73) Assignee: PCI Technologies, Inc., Ontario (CA)

( * ) Notice: Subject to any disclaimer, the term of this patent is extended or adjusted under 35 U.S.C. 154(b) by 0 days.

(21) Appl. No.: 10/157,633

(22) Filed: May 31, 2002

(65) Prior Publication Data

US 2003/0222710 A1 Dec. 4, 2003

(51) Int. Cl.⁷ .................................................. H03F 1/00
(52) U.S. Cl. ........................ 330/174; 330/307; 361/688
(58) Field of Search .................................. 330/174, 307; 361/688, 689, 690, 691, 692, 693, 694, 695, 704, 707, 730

(56) References Cited

U.S. PATENT DOCUMENTS

| | | | |
|---|---|---|---|
| 4,329,682 A | * | 5/1982 | Baker .......................... 340/581 |
| 4,663,599 A | | 5/1987 | Patch .......................... 330/311 |
| 5,130,891 A | | 7/1992 | Christie ....................... 361/391 |
| 5,229,925 A | | 7/1993 | Spencer et al. ............. 361/422 |
| D343,838 S | | 2/1994 | Frank et al. ................ D14/198 |
| 5,449,292 A | * | 9/1995 | Tani et al. ................... 434/114 |
| 5,521,792 A | * | 5/1996 | Pleitz et al. ................. 361/715 |
| 6,094,350 A | | 7/2000 | Achiriloaie .................. 361/737 |
| 6,265,936 B1 | | 7/2001 | Heigl et al. ................... 330/51 |
| 6,292,371 B1 | | 9/2001 | Toner, Jr. ..................... 361/752 |
| 6,309,245 B1 | | 10/2001 | Sweeney ..................... 439/507 |

OTHER PUBLICATIONS

Electroline News by E–mail, "EDA–UG 2404 & 2802" (printed May 6, 2002, 6 pp. total).
Tomorrow's Technology under Today's roof, "CATV/UHF Amplifiers" (printed May 6, 2002, 3 pp. total).

* cited by examiner

Primary Examiner—Henry Choe
(74) Attorney, Agent, or Firm—Blank Rome LLP

(57) ABSTRACT

An amplifier housing assembly is disclosed. The housing assembly includes a first section including a first plurality of holes; and a second section including a second plurality of holes. The first and second sections are interconnected. The first and second sections have a common back wall and a common bottom plate. The first plurality of holes and the second plurality of holes are at two different parallel planes.

20 Claims, 2 Drawing Sheets

DROP AMPLIFIER HOUSING WITH MULTIPLE TIERS

BACKGROUND OF THE INVENTION

1. Field of the Invention

The present invention relates to Cable-TV amplifiers. More particularly, the present invention relates to the multiple tier design of an amplifier housing.

2. Description of the Prior Art

A cable television (CATV) system distributes a broadband RF signal to individual subscriber locations. The headend originates the RF signal, and the distribution network divides, or distributes, the signal to each subscriber location. Amplifiers and line extenders carry the RF signal to a local distribution point near a group of subscriber locations. A tap is used to "tap" some of the RF signal from the local distribution point and deliver it to the subscriber's home via a coaxial drop cable.

Amplifiers associated with the drop cable are known as drop amplifiers. Drop amplifiers are known to include input and output ports facing opposite directions. In some situations, the conventional location of the ports makes it extremely difficult to position a drop amplifier in places where there is not much space. Therefore, there is a need in the art for a design of an amplifier housing that is compact and that includes ports that face a single direction.

SUMMARY AND OBJECTS OF THE INVENTION

It is a first object of the invention to provide a multiple tier design of an amplifier housing unit that allows access to all the amplifier ports on one side of the unit.

A second object of the invention is to disclose a compact design that yields significant signal isolation in the return band, can accommodate low intermodulation circuitry inside and a LED power indicator on the top face of the unit, and optimizes space for connection of cable connectors so that users can manually twist cable connectors onto the ports.

A third object of the invention is to increase the air flow under the housing so as so avoid the overheating of the amplifier and to minimize moisture collection which could lead to corrosion.

A fourth object of the present invention is to provide a ground block on the side of unit that has three access points that the ground wire can pass through, and that is threaded so a ground screw can fasten down onto the wire.

A fifth object of the present invention is to provide a corrosion free and water proof housing after the housing has been fully assembled with coaxial connectors and the back plate installed.

The present invention includes a multiple tier amplifier housing assembly. The assembly includes a first cavity and a second cavity forming an L-shaped module. The first cavity includes a number of holes that are aligned at a plane that is parallel to a number of holes in the second cavity. Further, the holes from the first cavity can be both vertically and horizontally offset with respect to the holes in the second cavity. Both sets of holes are located away from the back wall of the housing.

With these and other objects, advantages and features of the invention that may become hereinafter apparent, the nature of the invention may be more clearly understood by reference to the following detailed description of the invention, the appended claims and to the several drawings attached herein.

BRIEF DESCRIPTION OF THE DRAWINGS

The preferred embodiments of this invention will be described in detail, with reference to the following figures, wherein.

DETAILED DESCRIPTION OF THE PREFERRED EMBODIMENTS

Figure 1:
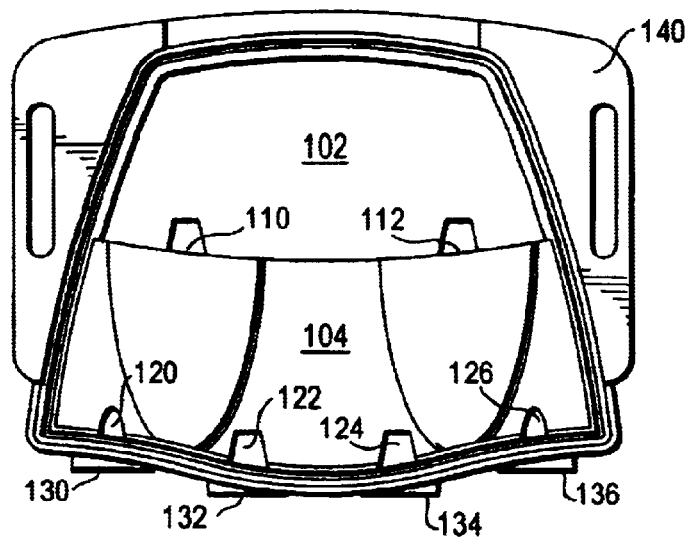
FIG. 1 is a diagram showing a first view of the amplifier housing of the present invention.

FIG. 1 shows a bottom view (looking up into the cavity) of an amplifier housing assembly 100 according to the present invention. The housing 100 is a two-tier design comprised of an upper section 102 and a lower section 104. The amplifier circuitry (not shown) may be fit in those two sections.

The section 102 includes holes 110 and 112 that may be used to access the ports from the amplifier circuitry. Likewise, section 104 includes holes 120, 122, 124, and 126. Connectors 130, 132, 134, and 136 may be fit into the holes to gain access to the amplifier ports from outside the housing 100. Section 102 may also include a hole (not shown) to accommodate a power indicator LED.

Section 102 may be sectioned off to allow for a DC chamber. The DC chamber may then be isolated from the rest of the amplifier circuitry so that no RF signals enter into the DC chamber. The DC chamber is where the power regulator is located and where the power indicator LED is mounted.

Figure 2:
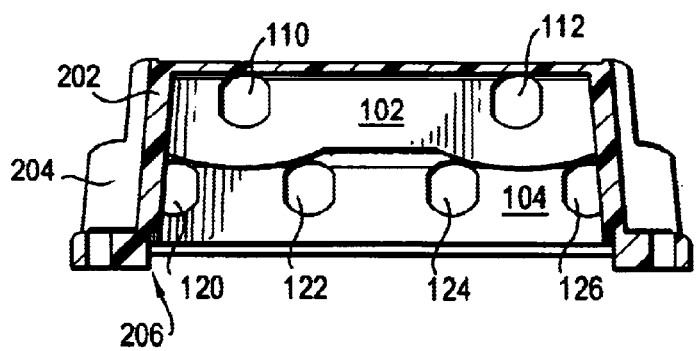
FIG. 2 is a diagram showing a second view of the amplifier housing of the present invention.

FIG. 2 shows a first cross-sectional view of the housing 100. The figure illustrates a bottom plate 208. The plate 208 may be assembled by pushing it against the frame 202 of the housing 100 (in between the ends 206 of the frame 202). The disclosed structure allows air to flow underneath the housing 100, which serves to keep the amplifier circuitry cool and minimizes moisture collection, which could lead to corrosion. After the amplifier has been placed inside the housing 100 and the bottom plate 208 has been assembled, the housing 100 may be covered with a sealing material such as epoxy. There may also be an RF gasket material placed in the groove of the main housing which the bottom plate pushes into in order to preserve the RF integrity of the unit (i.e., no signal leakage). Once the bottom plate is assembled, epoxy is applied, and the connectors are installed, the unit becomes environmentally and RF tight.

Figure 3:
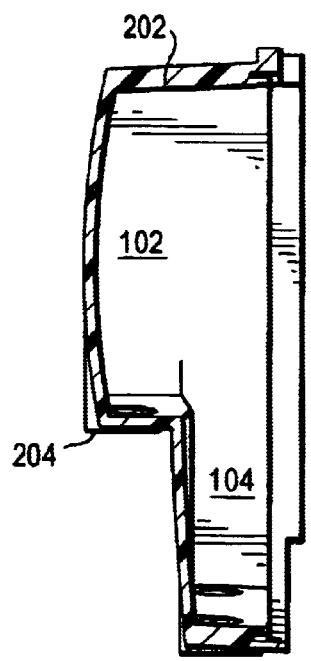
FIG. 3 is a diagram showing a third view of the amplifier housing of the present invention.

FIG. 3 shows a second cross-sectional view of the housing 100. The frame 202 may be made out of die cast material such as aluminum. FIG. 3 also illustrates the two-tier aspect of the housing design. Particularly, the sections 102 and 104 are formed so that their respective holes are offset from each other in the horizontal direction. The two sections may also be characterized as an L-shaped cavity.

Holes 110 and 112 may be at a plane different from the plane at which holes 120, 122, 124 or 126 are located. That is, the holes from the first section 102 are vertically offset from the holes of section 104. The different planes may also be substantially parallel to each other.

Figure 4:
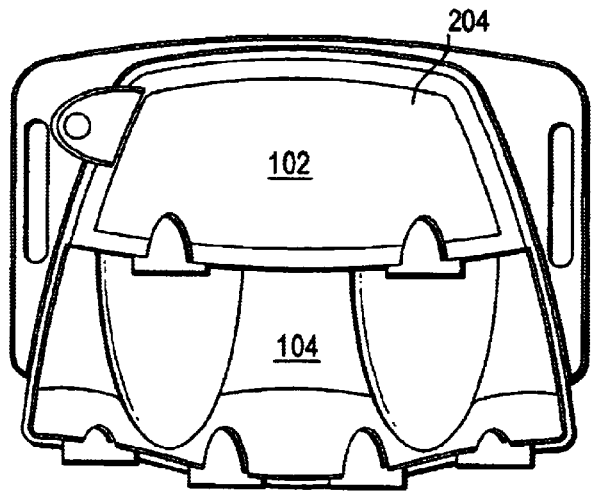
FIG. 4 is a diagram showing a fourth view of the amplifier housing of the present invention.

FIG. 4 shows a top view of the housing 100 once it has been fully assembled.

Figure 5:
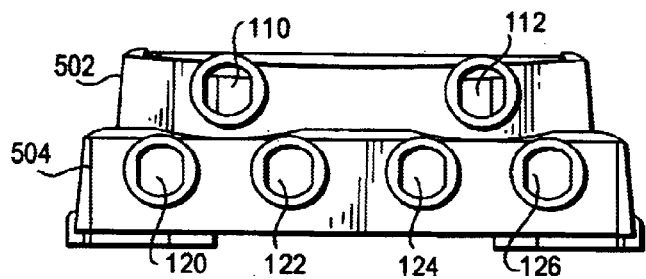
FIG. 5 is a diagram showing a fifth view of the amplifier housing of the present invention.
Figure 6:
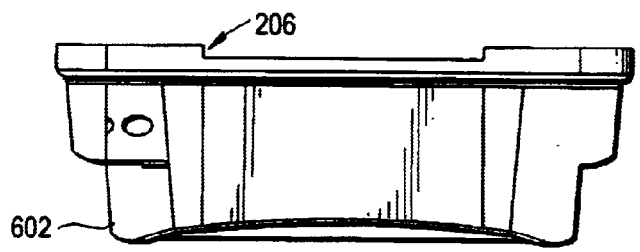
FIG. 6 is a diagram showing a sixth view of the amplifier housing of the present invention.

FIG. 5 shows a front view of the housing 100, showing the first tier 502 and the second tier 504. FIG. 6 is an inverted view 602 of the housing.

Figure 7:
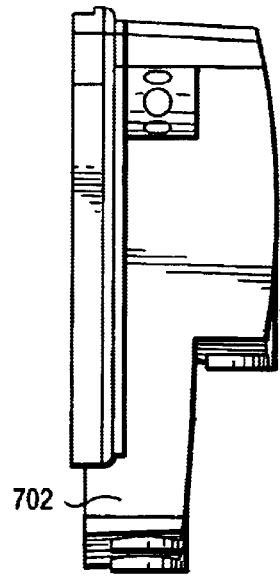
FIG. 7 is a diagram showing a seventh view of the amplifier housing of the present invention.

FIG. 7 is a side view 702 of the housing 100. The housing 100 includes a ground block 704 on its side. The ground block 704 has three access or entry points 706, 708, and 710 that the ground wire (not shown) can pass through. The ground block 704 may be threaded so that a ground screw may fasten down onto the ground wire.

While this invention has been described in conjunction with the specific embodiments outlined above, it is evident that many alternatives, modifications and variations are apparent to those skilled in the art. Accordingly, the preferred embodiments of the invention as set forth above are intended to be illustrative and not limiting. Various changes may be made without departing from the spirit and scope of the invention.

What is claimed is:

1. An amplifier housing assembly, comprising:
a bottom plate wherein the bottom plate is pushed against a groove in the frame to form the amplifier housing assembly; and
a frame forming
a first section including a first plurality of holes, and
a second section including a second plurality of holes and interconnected with the first section, wherein the first and second sections have a back wall of the frame and the bottom plate in common, and the first plurality of holes and the second plurality of holes are at two different planes.

2. The amplifier housing assembly of claim 1, wherein the first plurality of holes are horizontally offset from the second plurality of holes.

3. The amplifier housing assembly of claim 1, wherein the different planes are parallel to each other.

4. The amplifier housing assembly of claim 1, wherein the frame is made of die cast material.

5. The amplifier housing assembly of claim 4, wherein the die cast material is aluminum.

6. The amplifier housing assembly of claim 1, wherein the first plurality of holes are vertically offset from the second plurality of holes.

7. The amplifier housing assembly of claim 1, wherein a layer of epoxy is applied to the frame.

8. The amplifier housing assembly of claim 1, wherein the first and second plurality of holes face a direction opposite to the back wall.

9. An amplifier housing assembly, comprising:
a frame forming a two-tier L-shaped cavity;
a bottom plate that is pushed against the frame to form the amplifier housing assembly;
a first plurality of holes formed on a first tier of the frame; and
a second plurality of holes formed on a second tier of the frame; wherein the first plurality of holes and the second plurality of holes are at two different planes.

10. The amplifier housing assembly of claim 9, wherein the first plurality of holes are horizontally offset from the second plurality of holes.

11. A The amplifier housing assembly of claim 9, wherein the different planes are parallel to each other.

12. The amplifier housing assembly of claim 9, wherein the frame is made of die cast material.

13. The amplifier housing assembly of claim 12, wherein the die cast material is aluminum.

14. The amplifier housing assembly of claim 9, wherein the first plurality of holes are vertically offset from the second plurality of holes.

15. The amplifier housing assembly of claim 9, wherein a layer of epoxy is applied to the frame.

16. The amplifier housing assembly of claim 9, wherein the first and secondlurality of holes face a direction opposite to a back wall of the frame.

17. The amplifier housing assembly of claim 1, wherein the groove includes an RF gasket material.

18. The amplifier housing assembly of claim 1, wherein the frame includes a ground block having entry points.

19. The amplifier housing assembly of claim 18, wherein the entry points comprise a plurality of holes which a ground wire passes through.

20. The amplifier housing assembly of claim 18, wherein the entry points consist of three holes which a ground wire passes through.

\* \* \* \* \*